United States Patent [19]

Nakano

[11] 4,453,265
[45] Jun. 5, 1984

[54] SPEAKER DRIVING CIRCUIT

[75] Inventor: Masao Nakano, Tokyo, Japan

[73] Assignee: General Research of Electronics, Inc., Tokyo, Japan

[21] Appl. No.: 278,312

[22] Filed: Jun. 29, 1981

[51] Int. Cl.³ .............................................. H03F 21/00
[52] U.S. Cl. .................................................... 381/120
[58] Field of Search ............. 179/1 A, 1 AT, 84 VF, 179/81 R, 90 B; 455/35, 37, 174, 194, 218–225; 381/82–85, 111, 116, 117, 120, 121

[56] References Cited

U.S. PATENT DOCUMENTS 3,051,788  8/1962  Seeley .................................. 179/1 A
3,970,801  7/1976  Ross et al. .................. 179/84 VF X
4,146,845  3/1979  Lunquist .............................. 179/1 A

OTHER PUBLICATIONS

International Application WO80/01529, Jul. 24, 1980, Ponto, R., "Multiple Program Audio System".

Primary Examiner—A. D. Pellinen
Assistant Examiner—W. J. Brady
Attorney, Agent, or Firm—Trexler, Bushnell & Wolters, Ltd.

[57] ABSTRACT

A speaker driving circuit for use with an audio amplifier made selectively ineffective comprising switching means for providing intermittent current to the speaker when said means is energized.

4 Claims, 4 Drawing Figures

PRIOR ART

SPEAKER DRIVING CIRCUIT

BACKGROUND AND SUMMARY OF THE INVENTION

This invention relates to a speaker driving circuit and particularly to a circuit for providing, from an audio speaker, sounds by which operations of a key-board, various switches and the like are confirmed, for example, in a PLL synthesized radio receiver with the key-board for data entry.

In such receiver, when a key push button on the key-board is depressed, a sound is generated from the audio speaker equipped on the receiver housing, whereby the depression can be confirmed.

Prior art circuits for providing such operation confirming sounds have used an audio amplifier which is in active state, and, therefor during the operation mode of muting, squelching or the like wherein the audio amplifier is made ineffective, the operation confirming sounds could not be generated.

The main object of the invention is to provide the operation confirming sounds even though the audio amplifier is ineffective. Other objects of the invention will be clear from the detailed explanation of the invention.

DETAILED DESCRIPTION OF THE INVENTION

Figure 1:
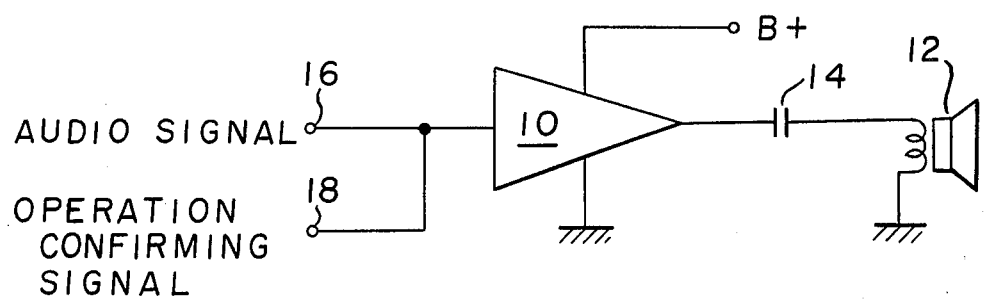
FIGS. 1 and 2 show circuit diagrams of the prior art circuit, respectively.

Referring now to FIG. 1 showing one of the typical prior art circuit for providing the operation confirming sound in response to the operation of the key-board, switch or the like, a conventional audio amplifier 10 driving a loud speaker 12 through a D.C. rejecting capacitor 14 receives an audio signal at an input 16 which may be an output of a detector or discriminator circuit of the PLL synthesized radio receiver. The amplifier 10 also receives the operation confirming signal at an input 18. The operation confirming signal which may be generated in a muting or squelch circuit of the receiver in response to the actuation of the push button on the key-board or the switch of the receiver is in the form of the burst of a sine or square waveform. The input 16 is connected to the input 18, and, therefor, whenever the operation confirming signal is received at the input 18, the audio amplifier 10 amplifies the operation confirming signal so that it drives the speaker 12.

Figure 2:
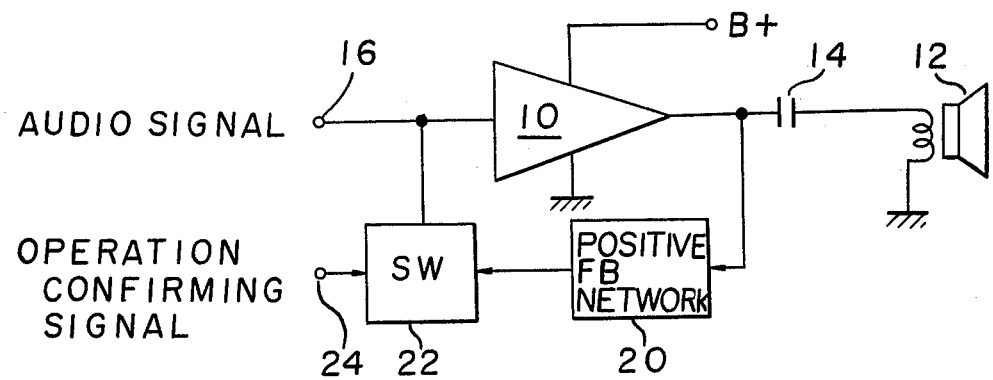

The other typical prior art circuit shown in FIG. 2 uses feedback technique. This includes a positive feedback network 20 which is well known in the art. The feedback network 20 is connected between the input and output of the amplifier 10 through a electronic switch 22 normally opened. When the switch 22 receives at its input 24 the operation confirming signal which is one logic level, for example, to close the switch 22, the positive feedback network 20 becomes effective so that the amplifier acts as an oscillator.

As is clear from the prior art circuit, the operation confirming sound from the speaker 12 can be provided only when the amplifier 10 is effective. Therefore, with these circuit constructions, it is impossible to create the operation confirming sound at the time when the operation of the audio amplifier is interrupted to save power consumption, for example, during muting or squelching of the radio receiver.

Figure 3:
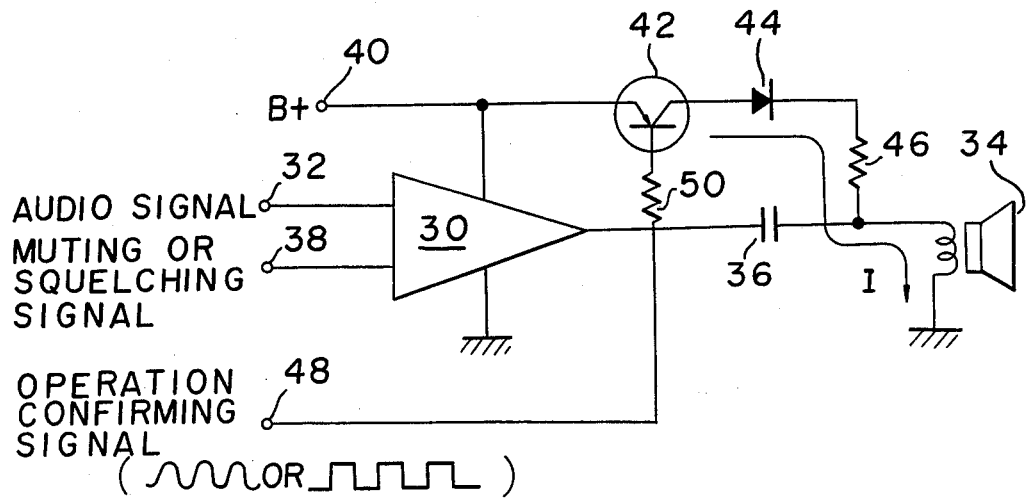
FIGS. 3 and 4 show circuit diagrams of the embodiments of the invention, respectively.

This invention overcomes the above prior art disadvantages. FIG. 3 is one embodiment of the invention, which comprises an audio power amplifier 30 adapted to receive an audio signal at an input 32. The amplifier 30 amplifies this audio signal so that the output from the amplifier 30 drives a loud speaker 34 through a DC rejecting capacitor 36. One side of the speaker 34 is connected to the ground. The amplifier 30 also receives at its second input 38 an amplifier operation inhibiting signal, such as a muting or squelch signal from the radio receiver set. During this amplifier operation inhibiting signal applied to the input 38, the amplifier is made ineffective in the conventional way, so that even though there is the audio signal at the first input 32 the amplifier does not produce its output to the speaker 34. The amplifier is energized by B+ power supply at a terminal 40. It is known in the prior art to construct such amplifier arrangement with a conventional IC.

In accordance with the principle of this invention, a switching means such as a transistor 42 is provided for applying switch current to the speaker 34 in response to the operation confirming signal. Specially, in FIG. 3 a PNP transistor 42 is connected to the circuit in such a manner that its emitter is coupled to the B+ terminal and the collector is coupled to the ungrounded side of the speaker 34 through a diode 44 and a resistor 46. The anode of the diode 44 is connected to the collector of the transistor 42 and the cathode of the diode is connected to the junction of the capacitor 36 and the ungrounded side of the speaker 34 through the resistor 46. The base of the transistor 42 receives the operation confirming signal at the terminal 48 through a resistor 50. The operation confirming signal is in the form of a sine wave or square wave for example and generated in response to the pushing of a key on the key-board or the actuation of a switch bottom of the radio set. During the ground and minus levels of the waveform, the transistor 42 is intermittently turned on. This produces intermittent current I passing from the B+ terminal 40 through the conducted transistor 42, the diode 44, the resistor 46 and the voice coil of the speaker 34 to the ground. Please note that this current can flow even when the amplifier 30 is made ineffective. The intermittent current creates the operation confirming sound from the speaker 34. The diode is provided for a mere protection purpose, and therefore it is not an essential part for the invention. The resistor 46 limits the amount of the current I.

Figure 4:
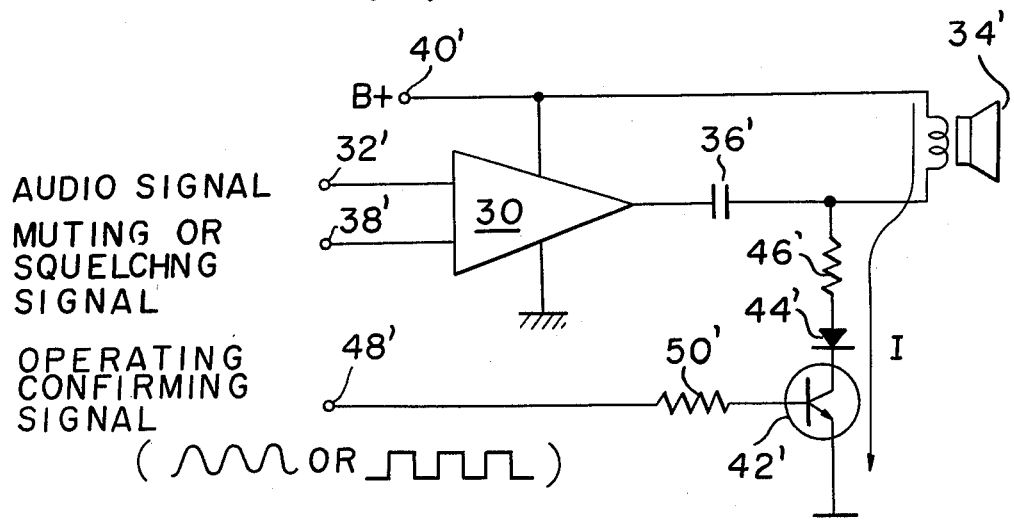

FIG. 4 is another embodiment of the invention wherein a NPN transistor 42' is used in place of the PNP transistor 42 in FIG. 3 embodiment. Corresponding elements in FIG. 4 to those in FIG. 3 have respective dashed reference numerals. The one end of the voice coil of the speaker 34 is connected to the B+ power supply terminal 40' and the other end is connected to the collector of the NPN transistor 42 through the current limiting resistor 46' and the protection diode 44', of which emitter is grounded. The base of the transistor 42' is adapted to receive the operation confirming signal at the input 48' in the form of the sine or square wave which makes the transistor 42' to turn on intermittently to flow the intermittent current into the speaker voice coil.

I claim:

1. A speaker driving circuit comprising:
   (i) a speaker with a voice coil;
   (ii) an audio amplifier receiving an audio input signal and having an output connected to said voice coil to drive said speaker;
   (iii) means for rendering said audio amplifier inactive;
   (iv) a power supply;
   (v) a plurality of manual controls; and
   (vi) circuit means for causing said speaker to emit a sound in response to operation of any one of said manual controls, and comprising switching circuit means coupled in circuit with said power supply and said voice coil for selectively providing intermittent current from said power supply to said voice coil independently of the operation of said audio amplifier, whereby said speaker generates a sound in response to said intermittent current; wherein said switching circuit means comprises a switching mode transistor having a collector-emitter junction coupled in circuit with said power supply and said voice coil and a base electrode coupled to receive a control signal for intermittently turning on said transistor; said control signal being produced in response to operation of any of said manual controls.

2. A speaker driving circuit responsive to operation of manual control means for generating a drive signal to a voice coil of a speaker independently of an audio amplifier normally coupled in circuit for driving said speaker so as to produce a sound confirming said operation of said manual control means, said driving circuit comprising: a power source, and switching means coupled in circuit with said power source and said voice coil for providing intermittent current to said voice coil in response to operation of said control means; wherein said switching means comprises a normally open switching element in circuit with said power source and said voice coil and having a control input responsive to an intermittent control signal produced in response to operation of said manual control means for intermittently closing a current path from said power source through said voice coil.

3. A speaker driving circuit according to claim 2 wherein said switching means comprises a switching mode transistor having a collector emitter junction coupled in circuit with said power supply and said voice coil and a base electrode coupled to receive a said control signal for intermittently turning on said transistor.

4. A speaker driving circuit according to claim 3 wherein said power source comprises a DC voltage supply.